(12) United States Patent
Takahashi

(10) Patent No.: US 7,994,716 B2
(45) Date of Patent: Aug. 9, 2011

(54) IMPACT AND COLOR RESISTANT ORGANIC ELECTROLUMINESCENT DISPLAY PANEL

(75) Inventor: Yoshikazu Takahashi, Tsukuba (JP)

(73) Assignee: Ulvac, Inc., Kanagawa (JP)

( * ) Notice: Subject to any disclaimer, the term of this patent is extended or adjusted under 35 U.S.C. 154(b) by 134 days.

(21) Appl. No.: 12/093,115

(22) PCT Filed: Nov. 6, 2006

(86) PCT No.: PCT/JP2006/322091
§ 371 (c)(1),
(2), (4) Date: Apr. 24, 2009

(87) PCT Pub. No.: WO2007/055168
PCT Pub. Date: May 18, 2007

(65) Prior Publication Data
US 2010/0026166 A1    Feb. 4, 2010

(30) Foreign Application Priority Data
Nov. 9, 2005    (JP) .................................. 2005-324348

(51) Int. Cl.
*H01L 35/24* (2006.01)
*C08K 5/15* (2006.01)
(52) U.S. Cl. .......... 313/512; 313/507; 313/508; 445/24; 445/25; 257/40

(58) Field of Classification Search .......... 313/501–512; 445/24–25
See application file for complete search history.

(56) References Cited

U.S. PATENT DOCUMENTS

| 5,688,855 | A * | 11/1997 | Stoy et al. | 524/505 |
| 2003/0164497 | A1* | 9/2003 | Carcia et al. | 257/40 |
| 2003/0209708 | A1* | 11/2003 | Kubota | 257/40 |

FOREIGN PATENT DOCUMENTS

| JP | 8-222368 A | 8/1996 |
| JP | 2004-281247 A | 10/2004 |
| WO | WO 2004/014977 A1 | 2/2004 |

* cited by examiner

Primary Examiner — Anne M Hines
Assistant Examiner — Tracie Green
(74) Attorney, Agent, or Firm — Arent Fox, LLP

(57) ABSTRACT

In the present invention, an organic EL device, which includes first and second display electrodes and at least one organic functional layer sandwiched between the respective display electrodes and composed of an organic compound, a high-molecular compound film covering the organic EL device and a surface of a substrate in the periphery of the organic EL device, an inorganic barrier film covering the high-molecular compound film, the edge of the high-molecular compound film, and a surface of the substrate in the periphery of the high-molecular compound film are formed on the substrate. In this case, a aliphatic polyurea film is used as the high-molecular compound film.

5 Claims, 2 Drawing Sheets

IMPACT AND COLOR RESISTANT ORGANIC ELECTROLUMINESCENT DISPLAY PANEL

CROSS-REFERENCE TO RELATED APPLICATION

This application is a National Stage entry of International Application No. PCT/JP2006/322091, filed Nov. 6, 2006, the entire specification claims and drawings of which are incorporated herewith by reference.

FIELD OF THE INVENTION

The present invention relates to an organic EL display panel using an organic electroluminescence (hereinafter, called "organic EL") device.

DESCRIPTION OF BACKGROUND ART

Since an organic EL display panel can be manufactured at a relatively low cost and moreover the size of the EL display panel itself can be easily increased, it is recently considered promising to use the panel to products such as a digital clock, a laptop computer, a pager, a mobile phone, a calculator, and the like. In general, an organic EL device constituting an organic EL display panel is composed of a transparent electrode as an anode, an organic functional layer, and a metal electrode as a cathode which are sequentially layered on a surface of a transparent substrate. Light can be emitted from the substrate side in such a manner that the exciters, which are formed when electrons and holes injected from both the electrodes in the state that the organic functional layer is sandwiched between the anode and the cathode are recombined, return from an excited state to a ground state and generate light.

In this case, the organic functional layer is, for example, a single layer of a light emission layer, a three-layered structure of an organic hole transport layer, a light emission layer, and an organic electron transport layer, or a two-layered structure of an organic hole transport layer and a light emission layer, and further a layered body provided with an electron or hole injection layer and a carrier block layer interposed between appropriate layers in the above structures.

Incidentally, the organic EL device has a problem in that when it is exposed to the atmosphere, it is liable to be deteriorated because it is affected by moisture, gases such as oxygen and the like, and a certain kind of other molecules existing in an environment in which it is used. In particular, the organic EL device is disadvantageous in that the characteristics thereof are prominently deteriorated in the interface between the electrodes and the organic functional layer thereof and thus light emission characteristics such as luminance and color, and the like are deteriorated.

To solve the above problems, it is known that after an organic EL device, which has first and second display electrodes and at least one organic functional layer sandwiched between the respective display electrodes and composed of an organic compound, is disposed on a surface of a substrate such as a glass and the like, a high-molecular compound film, which covers the organic EL device and the surface of the substrate in the periphery of the organic EL device, and an inorganic barrier film, which covers the high-molecular compound film and the edge thereof as well as covers the surface of the substrate in the periphery of the high-molecular compound film are sequentially layered. In this case, an aromatic polyurea film composed of a material monomer formed by an evaporation-polymerization method is used as the high-molecular compound film, and a silicon nitride film or a silicon nitride-oxide film is used as the inorganic barrier film (Patent Document 1).

Patent Document 1: Japanese Patent Application Laid-Open Publication No. 2004-281247 (refer to, for example, the description of paragraphs 0012, 0013)

DISCLOSURE OF THE INVENTION

Problems to be Solved by the Invention

However, when the high-molecular compound film composed of the aromatic polyurea film is used, a problem arises in that the high-molecular compound film is colored yellow because the aromatic polyurea film absorbs the light in the wavelength region of 350 to 400 µm of the light in the visible light region (350 to 830 nm) as shown in FIG. 2. Further, when the silicon nitride film or the silicon oxynitride film is used as the inorganic barrier film, since the silicon nitride film or the silicon nitride-oxide film is fragile, when external force is applied to the organic EL display panel from the outside by any reason, there is a possibility that the inorganic barrier film is cracked and the sealing property thereof is deteriorated.

SUMMARY OF THE INVENTION

In view of the above points, an object of the present invention is to provide an organic EL display panel which is prevented from being colored even if it receives light in a particular wavelength region and moreover has an impact resistance.

Means for Solving the Problems

To solve the problem, in an organic electroluminescence display panel of the present invention which comprises: an organic electroluminescence device, which has first and second display electrodes and at least one organic functional layer sandwiched between the display electrodes and composed of an organic compound; a substrate for supporting the organic electroluminescence device; a high-molecular compound film, which covers the organic electroluminescence device and a surface of the substrate in the periphery of the organic electroluminescence device; and an inorganic barrier film, which covers the high-molecular compound film, the edge of the high-molecular compound film, and a surface of the substrate in the periphery of the high-molecular compound film, a aliphatic polyurea film is used as the high-molecular compound film.

According to the present invention, since the aliphatic polyurea film is used as the high-molecular compound film, even if the high-molecular compound film receives light in the wavelength region of, in particular, 350 to 400 µm, it is suppressed from being colored and can maintain a colorless and transparent state.

In this case, when the aliphatic polyurea film is formed of a material monomer by an evaporation-polymerization method, a high-molecular compound film having a high purity can be preferably obtained because no solvent is used.

The material monomer preferably contains, for example, an aliphatic diamine monomer and an aliphatic diisocyanate monomer.

Further, any one selected from $Al_2O_3$, $ZrO_2$, $MgF_2$, and ITO is preferably used as the inorganic barrier film. Since a thin film composed of $Al_2O_3$, $ZrO_2$, $MgF_2$, and ITO has a small internal stress and a bending resistance (flexibility), even if an external force is applied to the organic EL display panel from the outside by any reason, the thin film absorbs the external force and exhibits a high impact resistance. As a result, there can be suppressed a possibility that the inorganic barrier film is cracked and the sealing performance thereof is deteriorated. Since these thin films do not almost absorb light in the wavelength region of 350 to 400 μm, when they are layered on the high-molecule compound film composed of the aliphatic polyurea film, they are suppressed from being colored even if they receive the light in the wavelength region of, in particular, 350 to 400 μm so that they can maintain the colorless transparent state.

In this case, when the inorganic barrier film is formed by the EB evaporation method, it can be preferably formed to the thin film in the state that it has a small internal stress.

Further, when a plurality of the high-molecular compound films and the inorganic barrier films are alternately layered, a particularly high damp-proof performance can be preferably obtained.

EFFECTS OF THE INVENTION

As described above, the EL display panel of the present invention achieves advantages in that it is prevented from being colored even if it receives light within a particular wavelength region and moreover has the impact resistance.

DESCRIPTION OF THE PREFERRED EMBODIMENTS

Best Mode for Carrying Out the Invention

Referring to FIG. 1, reference numeral 1 denotes an organic EL display panel of the present invention. The organic EL display panel includes a substrate 11 selected from an inorganic substance such as glass and the like and an organic substances such as a high-molecular compound and the like, and an organic EL device 2 is formed on a surface of the substrate 11. The organic EL device 2 is composed of a first display electrode 21, which constitutes an anode, at least one organic functional layer 22, which is composed of an organic compound, and a second display electrode 23, which constitutes a cathode, these display electrodes 21, 23 and the organic functional layer 22 are sequentially layered, and the organic functional layer 22 is sandwiched between the anode and the cathode.

The first display electrode 21 is composed of, for example, an ITO film and formed by a known method such as the EB evaporation method, a sputtering method, and the like and patterned to a predetermined shape by a photolithography process. The organic functional layer 22 has a known structure and is arranged by sequentially layering a hole injection layer composed of copper phthalocyanine, a hole transport layer composed of TPD (triphenylamine derivative), a light emission layer composed of Alq$_3$ (aluminum chelate complex), and an electron injection layer composed of Li$_2$O (lithium oxide) by, for example, an evaporation method. The second display electrode 23 is composed of, for example, an Al film, formed by a known method such as the EB evaporation method, a sputtering method, and the like, and patterned to a predetermined shape by a photolithography process.

Incidentally, when the organic EL device 2 is exposed to the atmosphere, it is liable to be deteriorated because it is affected by moisture, gases such as oxygen and the like, and certain kind of other molecules existing in an environment in which it is used. In particular, the characteristics of the organic EL device 2 are prominently deteriorated in the interface between the display electrodes 21 and 23 and the organic functional layer 22 of the organic EL device, thereby light emission characteristics such as luminance, color, and the like are deteriorated.

To cope with this problem, although it is preferable to sequentially layer a high-molecular compound film 3, which covers the organic EL device 2 and a surface of the substrate 11 in the periphery of the organic EL device 2 and an inorganic barrier film 4 which covers the high-molecular compound film 3, the edge of the high-molecular compound film 3, and a surface of the substrate 11 in the periphery of the high-molecular compound film 3, the organic EL device 2 must be prevented from being colored even if it receives light in a particular wavelength region and further have an impact resistance.

In the embodiment, a aliphatic polyurea film is used as the high-molecular compound film 3. The aliphatic polyurea film 3 is formed of a material monomer containing an aliphatic diamine monomer and an aliphatic diisocyanate monomer by an evaporation-polymerization method in a range larger than a display region including pixels and the organic EL device using a mask having a predetermined opening formed thereto.

That is, after the interior of a vacuum chamber is vacuum exhausted to a predetermined pressure, the respective material monomers of the aliphatic diamine monomer and the aliphatic diisocyanate monomer are heated to a predetermined temperature, respectively so that they are evaporated and vaporized. Next, the respective monomers are subjected to contact reaction on the substrate 11 and the organic EL device 2 and deposited so that organic molecules are polymerized. As a result, the aliphatic polyurea film 3 is formed to a predetermined thickness so as to cover the organic EL device 2 and the surface of the substrate 11 in the periphery thereof as shown below. In this case, although the thickness of the aliphatic polyurea film 3 is not particularly limited, it is preferably set to a thickness in the range of 300 nm to 1000 nm to relax the stress of the inorganic barrier film 4.

[Formula 1]

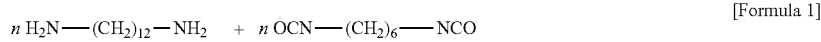

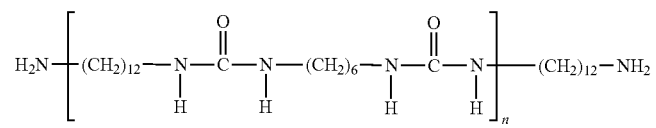

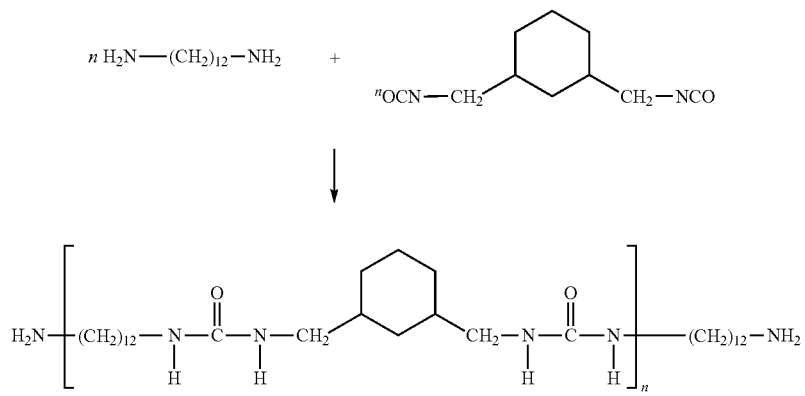

[Formula 2]

1,12-diaminododecane, 10-diaminododecane, 1,8-diaminooctane, 1,6-diamino hexane, 1,3-bis(aminomethyl)cyclohexane, and the like are exemplified as the aliphatic diamine monomer. Further, 1,3-bis(isocyanate methyl)cyclohexane, hexamethylene diisocyanate, and the like are exemplified as the aliphatic diisocyanate monomer.

The inorganic barrier film 4 formed on the aliphatic polyurea film 3 is selected from $Al_2O_3$, $ZrO_2$, $MgF_2$, and ITO and formed by the EB evaporation method. That is, after an EB evaporation device having a known structure is used and the interior of a vacuum chamber is vacuum exhausted up to a predetermined pressure, metal such as Al, Zr, and the like is heated by an electron beam and evaporated while a reactive gas such as oxygen, fluorine, and the like is introduced thereinto, reacted and deposited on the aliphatic polyurea film 3, thereby a desired thin film is formed so as to cover the aliphatic polyurea film 3, the edge of the aliphatic polyurea film 3, and a surface of the substrate 11 in the periphery of the aliphatic polyurea film 3. In this case, although the thickness of the inorganic barrier film 4 is not particularly limited, it is preferably set to a thickness within the range of 50 nm to 200 nm in consideration of a bending resistance and a barrier property. According to the above method, an evaporation rate can be determined to each element, the composition of the thin film can be easily controlled, the characteristics of the thin film can be prevented from being deteriorated because it is not damaged different from a plasma system, and moreover the internal stress of the thin film can be reduced.

In this case, a multilayer structure can be employed by alternately layering the high-molecular compound film 3 and the inorganic barrier film 4 so that a high damp-proof performance can be obtained. Further, the aliphatic polyurea film 3 on the organic EL device 2 may be subjected to an anneal treatment in vacuum or in an inert gas such as $N_2$ and the like at a predetermined temperature by which the organic functional layer 22 is not damaged to exhaust the gases in the film before the inorganic barrier film 4 is formed.

As described above, when the fatty acid polyurea film 3 and the inorganic barrier film 4 are formed, since they are suppressed from being colored even if they receive light in the wavelength region of, in particular, 350 to 400 μm, they can maintain a colorless transparent state. Further, since the thin film composed of $Al_2O_3$, $ZrO_2$, $MgF_2$, and ITO has a small internal stress and a bending resistance property, even if an external force is applied to the organic EL display panel 1 from the outside by any reason, the thin film absorbs the external force and exhibit a high impact resistance. As a result, there can be suppressed a possibility that the inorganic barrier film 4 is cracked and the sealing performance thereof is deteriorated. Since these thin films do not almost absorb light in the wavelength region of 350 to 400 μm, when they are layered on the high-molecule compound film composed of the fatty acid polyurea film 3, they are suppressed from being colored even if they receive the light in the wavelength region of, in particular, 350 to 400 μm so that they can maintain the colorless transparent state.

Example 1

A 50 μm thick polyester (PET) film substrate was used as a substrate, and a 1 μm thick first aliphatic polyurea film was formed on the film substrate by an evaporation-polymerization method using 1,12-diaminododecane and 1,3-bis(isocyanate methyl)cyclohexane as material monomers. A 0.1 μm thick inorganic barrier film composed of $Al_2O_3$ was layered on the aliphatic polyurea film by the EB evaporation method. Next, a second aliphatic polyurea film and a second inorganic barrier film each having the same thickness as the above films were layered on the first inorganic barrier film by the same procedure as that described above, and further a third aliphatic polyurea film having the same thickness as the above film was layered on the second inorganic barrier film (5 layers structure), thereby a specimen A of an example 1 was obtained.

Further, a 50 μm thick polyester (PET) film substrate was used as a substrate likewise the above substrate, and a 1 μm thick aliphatic polyurea film was formed on the film substrate by an evaporation-polymerization method using 1,12-diaminododecane and 1,3-bis(isocyanate methyl)cyclohexane as material monomers. Next, a 0.1 μm thick $Al_2O_3$ was layered on the aliphatic polyurea film by the EB evaporation method (two-layered structure), thereby a specimen B of the embodiment 1 was obtained.

Comparative Example 1

A 50 μm thick polyester (PET) film substrate was used as a substrate, and a 1 μm thick aromatic polyurea film was formed on the film substrate by an evaporation-polymerization method using 4☐4'-diphenylmethane diisocyanate and 4☐4-diamino-phenylmethan as material monomers. Next, a 0.1 μm thick silicon nitride film was layered on the aromatic polyurea film by a reactive sputtering method (two-layered structure), thereby a specimen of a comparative example 1 was obtained.

Then, the moisture transmittance of the respective specimens was measured by a pressure increase method ("Vacuum" Volume 35, No. 3, P 317 (1992)). Table 1 shows the moisture transmittance at that time together with the moisture transmittance of the polyester (PET) film substrate. According to the result of measurement, it can be found that the specimen B achieves moisture transmittance of 0.1 $g/m^2$ day, and the specimen A arranged as the multilayer structure can obtain a damp-proof performance exceeding the measurement limit of the moisture transmittance. Note that when the moisture transmittance of the specimens of the embodiment 1 was measured again by repeatedly winding them around a cylinder having a radius of 30 mm 20 times, the transmittance thereof was not changed□from which it can be found that the inorganic barrier film has a high bending resistance and suppresses the possibility that the sealing performance is deteriorated.

TABLE 1

|  | Substrate | Specimen A | Specimen B | Comparative Example 1 |
|---|---|---|---|---|
| Moisture Transmittance ($g/m^2$ day) | 30 | $10^{-4}$ or less | 0.1 | 1 |

Next, ultraviolet rays were irradiated onto the surfaces of the specimens A and B of the embodiment 1 and the specimen of the comparative example 1 at an ultraviolet ray intensity of mW/cm2, and the transmittance of light having a wavelength of 380 mm was measured.

Table 2 shows a result of measurement of the light transmittance at that time together with the transmittance of the respective specimens before the ultraviolet rays were irradiated thereonto. According to the result of measurement, the light transmittance of the specimen of the comparative example 1 was reduced about 10% after the ultraviolet rays were irradiated thereonto and the specimen was colored yellow. In contrast, it can be confirmed that the light transmittance of the specimens A and B was not changed even if the ultraviolet rays were irradiated thereonto and they remained in a colorless transparent state.

TABLE 2

|  | Substrate | Specimen A | Specimen B | Comparative Example 1 |
|---|---|---|---|---|
| Light Transmittance (%) | 93 | 92 | 93 | 90 |
| Light Transmittance after Ultraviolet rays are Irradiated (%) | 93 | 92 | 93 | 80 |

Figure 1:
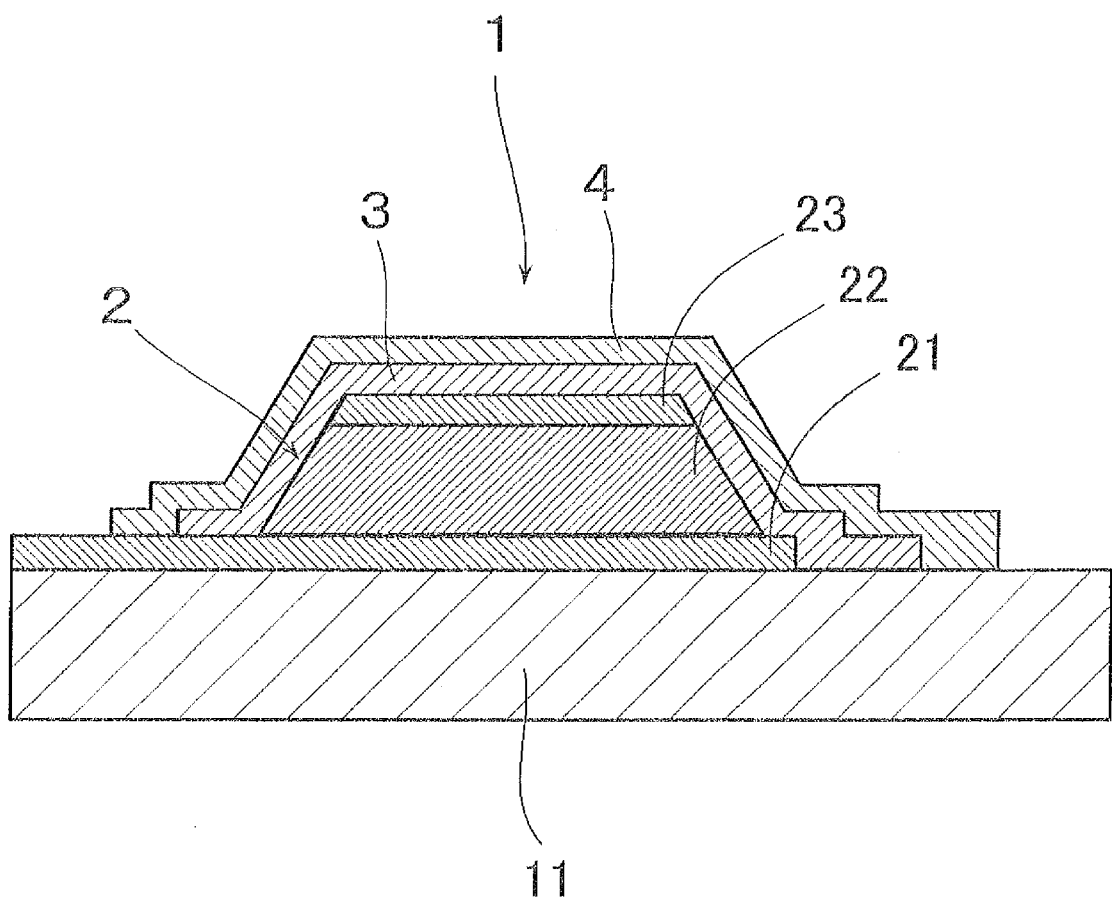
FIG. 1 is a sectional view explaining an organic EL display panel of the present invention.
Figure 2:
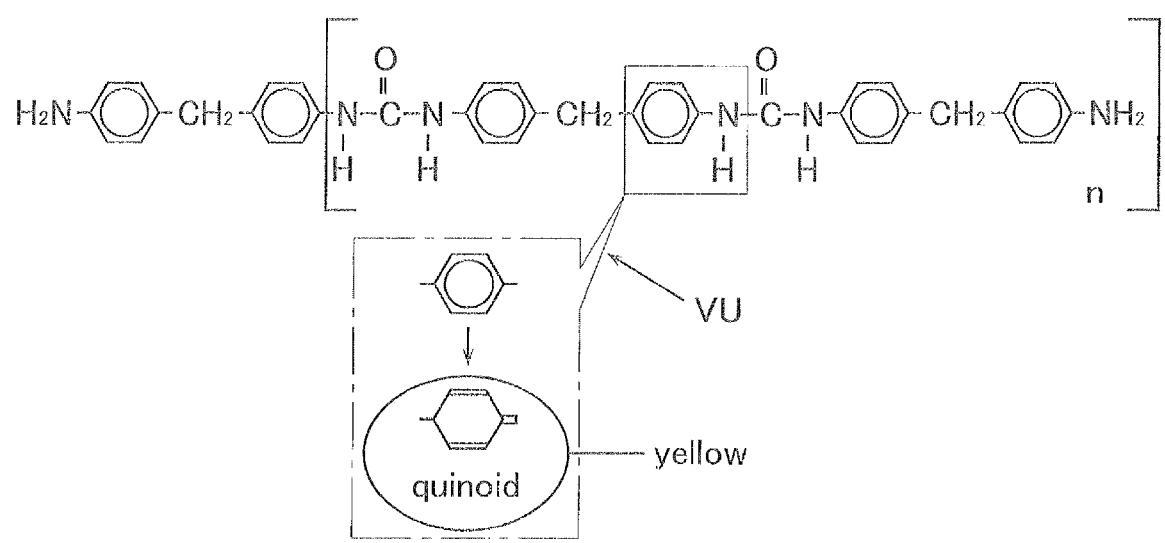
FIG. 2 is a view explaining coloring of a conventional organic EL display device.

REFERENCE NUMERALS 1 organic EL display panel
11 substrate
21, 23 display electrode
22 organic functional layer
3 high-molecular compound film
4 inorganic barrier film

The invention claimed is:

1. An organic electroluminescence display panel comprising:
    an organic electroluminescence device, which has first and second display electrodes and at least one organic functional layer sandwiched between the display electrodes and composed of an organic compound;
    a substrate for supporting the organic electroluminescence device;
    a high-molecular compound film, which covers the organic electroluminescence device and a surface of the substrate in the periphery of the organic electroluminescence device; and
    an inorganic barrier film, which covers the high-molecular compound film, the edge of the high-molecular compound film, and a surface of the substrate in the periphery of the high-molecular compound film,
    wherein a aliphatic polyurea film is used as the high-molecular compound film,
    wherein the aliphatic polyurea film is formed of a material monomer by an evaporation-polymerization method, and
    wherein the material monomer contains an aliphatic diamine monomer and an aliphatic diisocyanate monomer.

2. The organic electroluminescence display panel according to claim 1, wherein any one selected from $Al_2O_3$, $ZrO_2$, $MgF_2$, and ITO is used as the inorganic barrier film.

3. The organic electroluminescence display panel according to claim 2, wherein the inorganic barrier film is formed by the EB evaporation method.

4. The organic electroluminescence display panel according to claim 1, wherein a plurality of the high-molecular compound films and the inorganic barrier films are alternately layered.

5. The organic electroluminescence display panel according claim 2, wherein a plurality of the high-molecular compound films and the inorganic barrier films are alternately layered.

* * * * *